United States Patent [19]

Kim et al.

[11] Patent Number: 5,699,288
[45] Date of Patent: Dec. 16, 1997

[54] COMPARE CIRCUIT FOR CONTENT-ADDRESSABLE MEMORIES

[75] Inventors: Song Chin Kim, Temple; Peichun Peter Liu; Rajinder Paul Singh, both of Austin, all of Tex.

[73] Assignee: International Business Machines Corporation, Armonk, N.Y.

[21] Appl. No.: 683,292

[22] Filed: Jul. 18, 1996

[51] Int. Cl.[6] .................................................. G11C 15/04
[52] U.S. Cl. ..................... 365/49; 365/189.07; 365/190
[58] Field of Search ............................. 365/49, 189.97, 365/190

[56] References Cited

U.S. PATENT DOCUMENTS

| | | | |
|---|---|---|---|
| 5,386,379 | 1/1995 | Ali-Yahia et al. | 365/49 |
| 5,490,102 | 2/1996 | Jubran | 365/49 |
| 5,495,382 | 2/1996 | Albon | 365/49 |

Primary Examiner—David C. Nelms
Assistant Examiner—Andrew Q. Tran
Attorney, Agent, or Firm—Anthony V.S. England; Andrew J. Dillon

[57] ABSTRACT

A compare circuit for a content-addressable memory within a computer system is disclosed. In accordance with a preferred embodiment of the present invention, a compare circuit for a content-addressable memory comprises a pair of storage node lines, a pair of compare lines, and two sets of transistors. The pair of storage node lines are complementary to each other and are connected to a memory cell of the content-addressable memory for determining a state of the memory cell. In a like manner, the pair of compare lines are also complementary to each other. The first set of transistors are four transistors connected in series to be enabled by a logical one from one of the storage node lines for allowing a signal from one of the compare lines to propagate to an output. The second set of transistors are also four transistors connected in series to be enabled by a logical zero from the same storage node line for allowing a signal from the other compare line to propagate to the output. Under the present invention, a signal from either compare line needs to propagate through only one level of transistors in order to reach the output.

11 Claims, 5 Drawing Sheets

COMPARE CIRCUIT FOR CONTENT-ADDRESSABLE MEMORIES

BACKGROUND OF THE INVENTION

1. Technical Field

The present invention relates to an apparatus for data storage, in general and, in particular, to a content-addressable memory for storing data within a computer system. Still more particularly, the present invention relates to a compare circuit for a content-addressable memory within a computer system.

2. Description of the Prior Art

Many high-performance data processing systems include both a system memory and a cache memory. A cache memory is a relatively high-speed memory that stores a copy of information that is also stored in one or more portions of the system memory. The cache memory can be integrated within a processor device (on-chip) of the data processing system or remain separate from the processor device of the data processing system.

Content-Addressable Memories (CAMs) are commonly utilized in a processor device, which has an on-chip cache memory, for functions such as directory look-up. A CAM examines an input address to the on-chip cache memory by comparing the input address with all internally stored addresses. If any one of the internally stored addresses matches the input address, then the CAM signals that there is a match (or a "hit" in cache memory terminology). These match signals can be utilized to drive a global wordline within an associated data array of the on-chip cache memory for enabling a specific data word to be output.

For a CAM to be effective as a directory look-up for the on-chip cache memory, the comparing step between the input address to the on-chip cache memory and the internally stored addresses must be very efficient. The compare circuits known in the prior art tend to have high capacitance and long delays. This is attributed to the fact that the compare signals have to propagate through more than one level of transistors within the critical path. Also, the high number of contacts utilized in the prior art compare circuit design also adversely affects the speed of the compare signals. Consequently, it would be desirable to provide an improved compare circuit for a content-addressable memory within a computer system.

SUMMARY OF THE INVENTION

In view of the foregoing, it is therefore an object of the present invention to provide an improved apparatus for data storage.

It is another object of the present invention to provide an improved content-addressable memory for storing data within a computer system.

It is yet another object of the present invention to provide an improved compare circuit for a content-addressable memory within a computer system.

In accordance with a preferred embodiment of the present invention, a compare circuit for a content-addressable memory comprises a pair of storage node lines, a pair of compare lines, and two sets of transistors. The pair of storage node lines are complementary to each other and are connected to a memory cell of the content-addressable memory for determining a state of the memory cell. In a like manner, the pair of compare lines are also complementary to each other. The first set of transistors are four transistors connected in series to be enabled by a logical one from one of the storage node lines for allowing a signal from one of the compare lines to propagate to an output. The second set of transistors are also four transistors connected in series to be enabled by a logical zero from the same storage node line for allowing a signal from the other compare line to propagate to the output. Under the present invention, a signal from either compare line needs to propagate through only one level of transistors in order to reach the output.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF PREFERRED EMBODIMENT

The present invention may be implemented in any data processing system having a content-addressable memory (CAM). Also, it is understood that the features of the present invention may be applicable to a primary cache, a secondary cache, a translation buffer, and the like, wherever a CAM is applicable.

Figure 1:
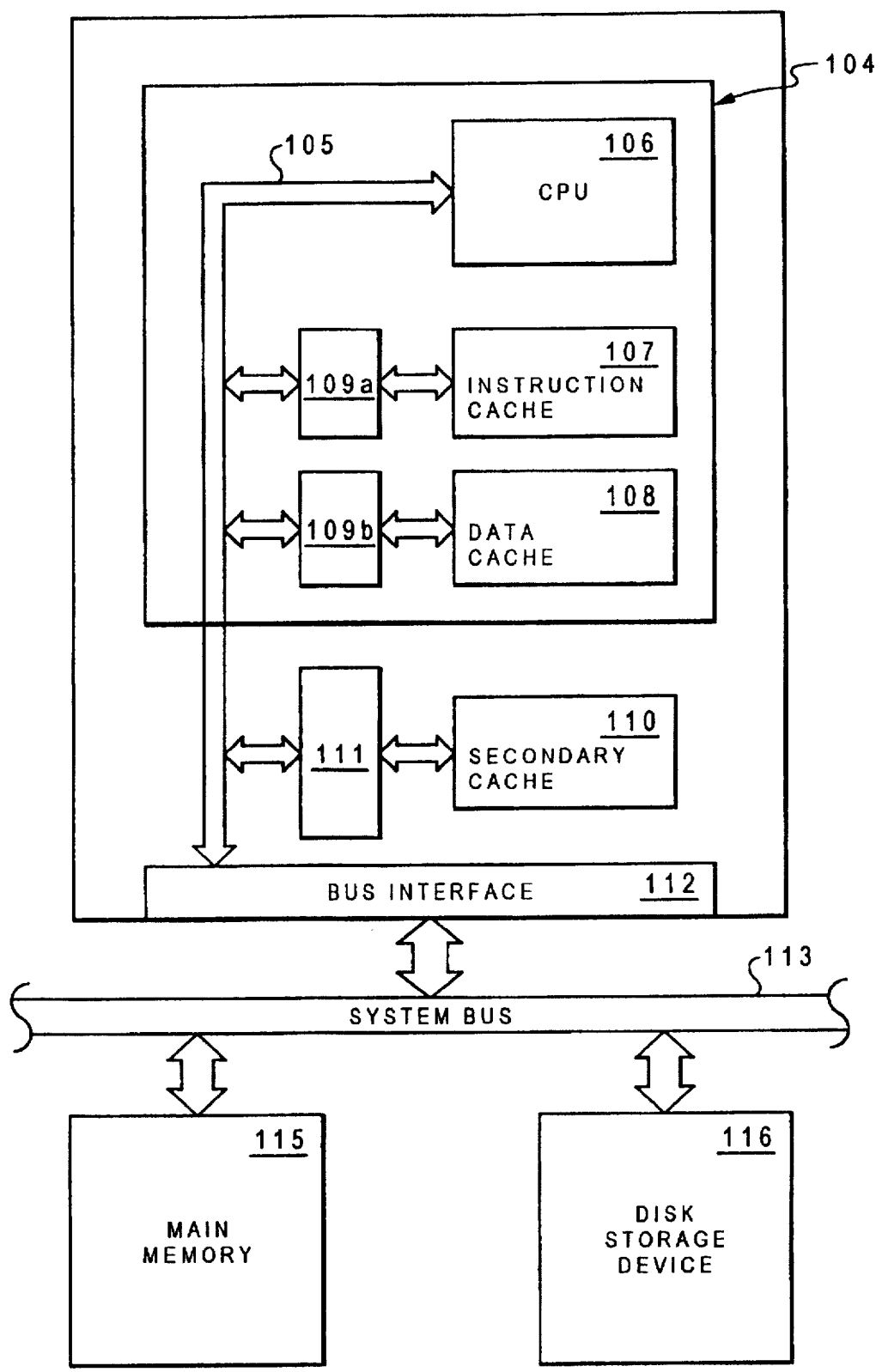
FIG. 1 is a block diagram of a typical data processing system in which a content-addressable memory, in accordance with a preferred embodiment of the invention, may be incorporated.

Referring now to the drawings and in particular to FIG. 1, there is illustrated a block diagram of a typical data processing system in which a CAM, in accordance with a preferred embodiment of the invention, may be incorporated. As shown, processor 104, having a CPU 106 which may be of a superscalar RISC type, is constructed as a single-chip device comprising on-chip instruction cache 107 and data cache 108. Both caches 107, 108 are connected to CPU 106 by separate paths within a local bus structure. Instruction cache 107 is connected to local bus 105 via cache controller 109a, while data cache 108 is connected to local bus 105 via cache controller 109b. A secondary cache 110 is also connected to local bus 105 via cache controller 111. Secondary cache 110 is usually much larger than either instruction cache 107 or data cache 108, and access to secondary cache 110 is also somewhat slower than to either instruction cache 107 or data cache 108. CPU 106 is also connected to system bus 113 via bus interface 112 in which timing and control translations between local bus 105 and system bus 113 are taking place. In addition, a main memory 115 and a disk storage device 116 are coupled to system bus 113.

Instruction cache 107 and data cache 108 may be addressed by effective (i.e., untranslated) addresses as well as by real (i.e., physical) addresses. Thus, local bus 105 within processor 104 has a number of address buses, including effective address buses, real address buses, and instruction address buses. In contrast, secondary cache 110 is typically addressed by real addresses only.

Figure 2:
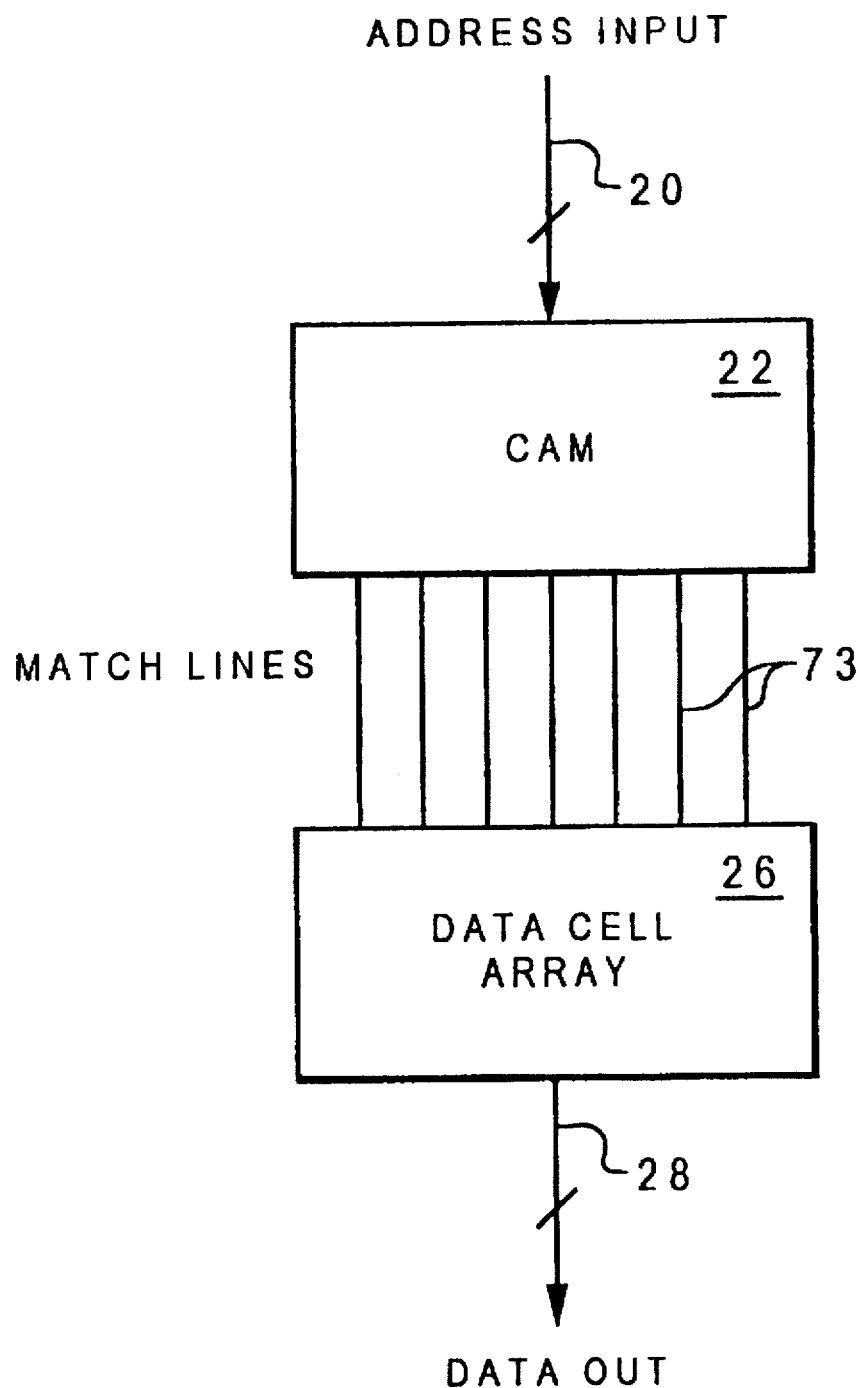
FIG. 2 is a block diagram illustrating a content-addressable memory in relation to its associated data cell array within the instruction cache or data cache of FIG. 1.

With reference now to FIG. 2, there is illustrated a block diagram of a CAM in relation to its associated data cell array within instruction cache 107 or data cache 108 of FIG. 1. As shown, an address may be sent to CAM 22 via address input 20. This address may be an effective address or a real address. After performing a comparison operation within CAM 22, one of several CAM match lines 73 will be utilized to drive a global wordline within an associated data cell array 26. Finally, data will come out through data out 28 of data cell array 26.

Figure 3:
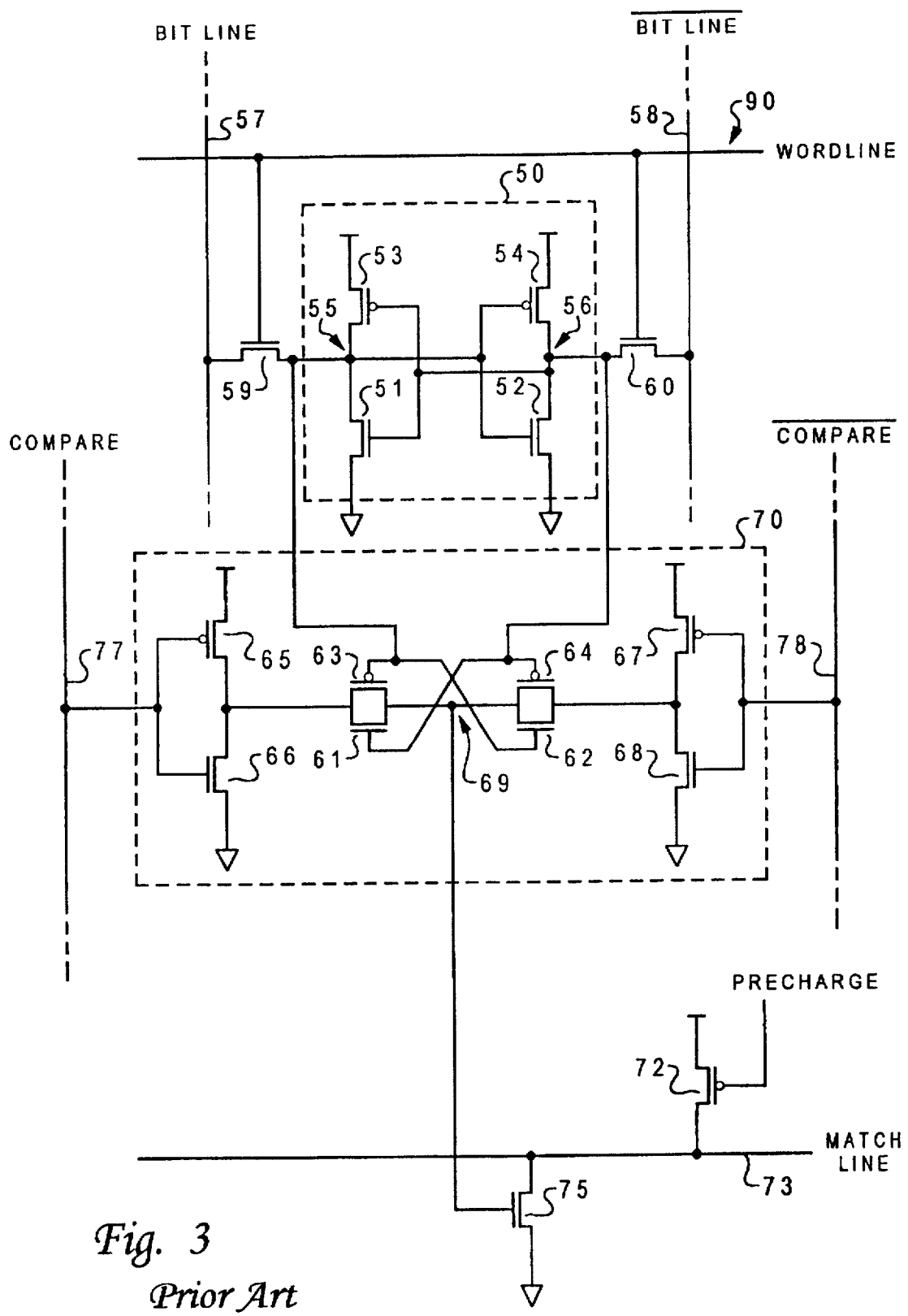
FIG. 3 is a schematic diagram of a CMOS content-addressable memory cell having a compare circuitry according to prior art.

Referring now to FIG. 3, there is depicted a schematic diagram of a CMOS CAM having a compare circuitry according to prior art. CAM cell 50 is a four-transistor SRAM memory cell having cross-coupled two n-channel driver transistors 51, 52 and two p-channel load transistors 53, 54. Typically, CAM cell 50 is similar to a data cell within data cell array 26 of FIG. 2. Data input/output nodes 55 and 56 of CAM cell 50 are connected to bitline 57 and $\overline{\text{bitline}}$ 58 via coupling transistors 59 and 60, respectively, A wordline 90 is connected to each gate of coupling transistors 59 and 60.

The CMOS CAM of FIG. 3 also contains a compare circuit 70 for comparison function. Compare circuit 70 comprises eight transistors. Inputs to compare circuit 70 are a pair of reference lines, compare 77 and $\overline{\text{compare}}$ 78. Both compare 77 and $\overline{\text{compare}}$ 78 represent a true-and-complement bit of address input 20 in FIG. 2. Compare 77 is connected to an input of an invertor circuit which comprises p-channel transistor 65 and n-channel transistor 66. $\overline{\text{Compare}}$ 78 is connected to an input of another invertor circuit which comprises p-channel transistor 67 and n-channel transistor 68. The outputs of both invertor circuits are connected to transistors 61–64. Each gate of n-channel transistor 62 and p-channel transistor 63 is driven by output node 55 of CAM cell 50 while each gate of n-channel transistor 61 and p-channel transistor 64 is driven by output node 56 of CAM cell 50. Output node 69 of compare circuit 70 is connected to a match line 73 via n-channel transistor 75.

Before the comparison operation, compare 77 and $\overline{\text{compare}}$ 78 are initially forced to a "high" state, and match line 73 is precharged to a "high" state through a p-channel transistor 72. When there is a valid address being input from address input 20, compare 77 and $\overline{\text{compare}}$ 78 are driven to an appropriate state by this valid address. Depending on the state of the address bit, compare 77 may go to a "high" state while $\overline{\text{compare}}$ 78 goes to a "low" state, or vice versa. Then, the comparison operation commences. If the address bit on compare 77 does not match the cell bit stored within CAM cell 50 (as appears at node 55), match line 73 will be discharged from the precharged "high" state through n-channel transistor 75. However, if the address bit on compare 77 matches the cell bit stored within CAM cell 50, match line 73 will remain in the precharged "high" state. The condition of match line 73 is subsequently latched to drive a global wordline (not shown) for the reading or writing of data in data cell array 26.

Figure 4:
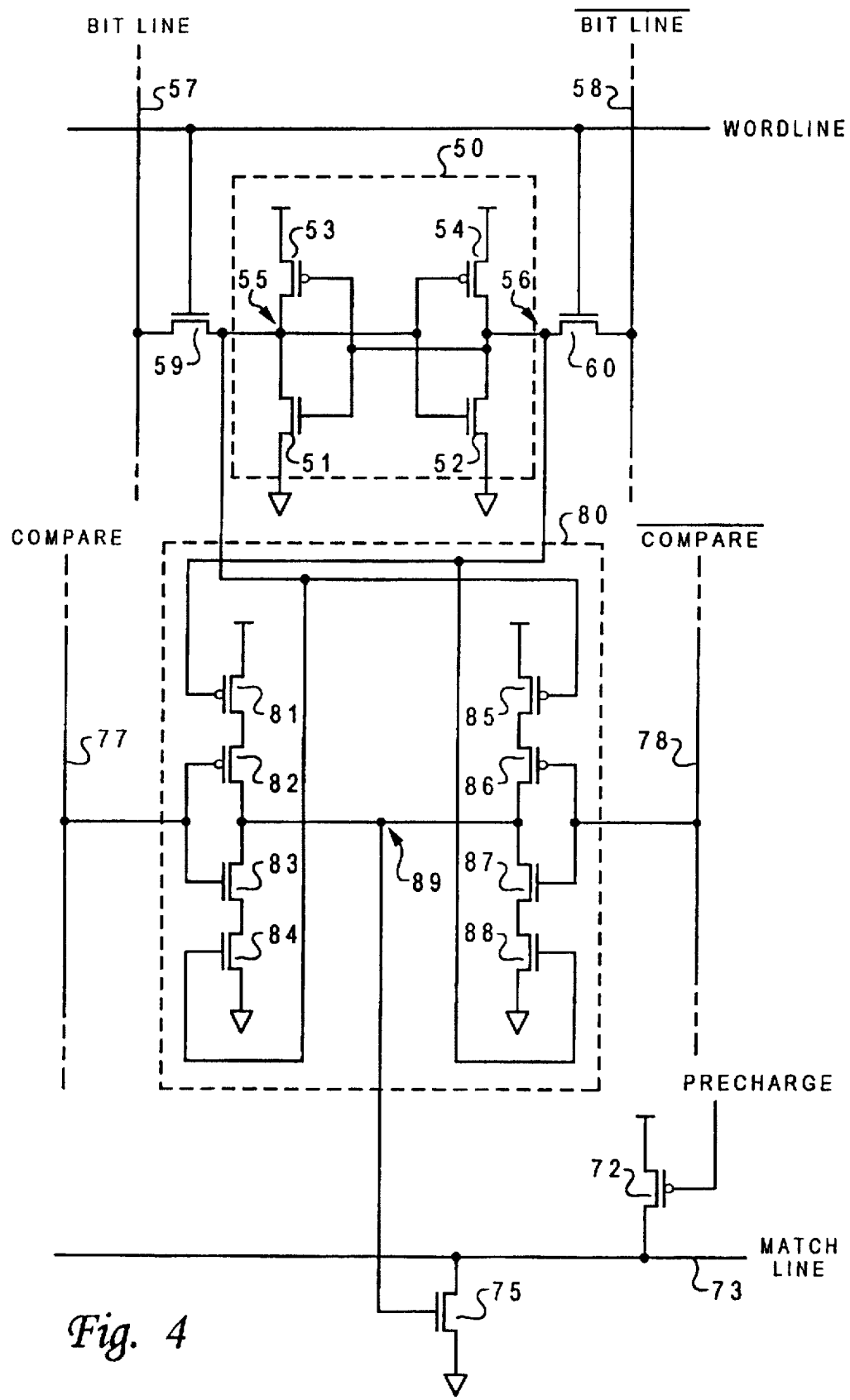
FIG. 4 is a schematic diagram of a CMOS content-addressable memory cell having a compare circuitry according to a preferred embodiment of the invention.

With reference now to FIG. 4, there is depicted a schematic diagram of a CMOS CAM cell having a compare circuitry according to a preferred embodiment of the invention. As shown, CAM cell 50 along with n-channel coupling transistors 59, 60 and p-channel transistor 72 for the precharging of match line 73 are identical to those depicted in FIG. 3. The novelty in FIG. 4 as compared to FIG. 3 lies upon the design of the compare circuitry.

Although compare circuit 80 of FIG. 4 also comprises eight transistors, the arrangement of these eight transistors is different from those shown in FIG. 3. As shown in FIG. 4, p-transistors 81 and 82 are connected in series with n-transistors 83 and 84. Similarly, p-transistors 85 and 86 are connected in series with n-transistors 87 and 88. The drains of both p-channel transistors 81, 85 are connected to a power line, $V_{dd}$ and the sources of both n-channel transistors 84, 88 are connected to the ground or $V_{ss}$. Each gate of transistors 82 and 83 is connected to compare 77 while each gate of transistors 86 and 87 is connected to $\overline{\text{compare}}$ 78. In addition, the gate of p-channel transistor 85 and the gate of n-channel transistor 84 are connected to node 55 of CAM cell 50 and the gate of p-channel transistor 81 and the gate of n-channel transistor 88 are connected to node 56 of CAM cell 50. The output node 89 of compare circuit 80 is connected to match line 73 via n-channel transistor 75.

Before the comparison operation, compare 77 and $\overline{\text{compare}}$ 78 are initially forced to a "high" state, and match line 73 is precharged to a "high" state through a p-channel transistor 72. Further, under this configuration, the state of CAM cell 50 (as appears at node 55) pre-conditions p-channel transistor 85 and n-channel transistor 84 as well as p-channel transistor 81 and n-channel transistor 88. Thus, an address bit from either compare 77 or $\overline{\text{compare}}$ 78 can control the gate of n-channel transistor 75 via node 89 during the comparison operation. The comparison operation commences after a valid address has been input from address input 20, and both compare 77 and $\overline{\text{compare}}$ 78 are driven to an appropriate state by this valid address. If a "0" (a "low" state) is stored within CAM cell 50 (as appears at node 55), then p-channel transistor 85 and n-channel transistor 88 will be turned on while p-channel transistor 81 and n-channel transistor 84 will be turned off. This allows p-channel transistor 86 and n-channel transistor 87 to invert a signal from $\overline{\text{compare}}$ 78. At this point, a "1" on $\overline{\text{compare}}$ 78 will maintain the precharged "high" state on match line 73 to signify a "match" while a "0" on $\overline{\text{compare}}$ 78 will turn on n-channel transistor 75 to drain the charges on match line 73.

Contrarily, if a "1" (a "high" state) is stored within CAM cell 50 (as appears at node 55), then p-channel transistor 81 and n-channel transistor 84 will be turned on while p-channel transistor 85 and n-channel transistor 88 will be turned off. This allows p-channel transistor 81 and n-channel transistor 84 to invert a signal from compare 77. At this point, a "1" on compare 77 will maintain the precharged "high" state on match line 73 to signify a "match" while a "0" on compare 77 will turn on n-channel transistor 75 to drain the charges on match line 73.

Figure 5:
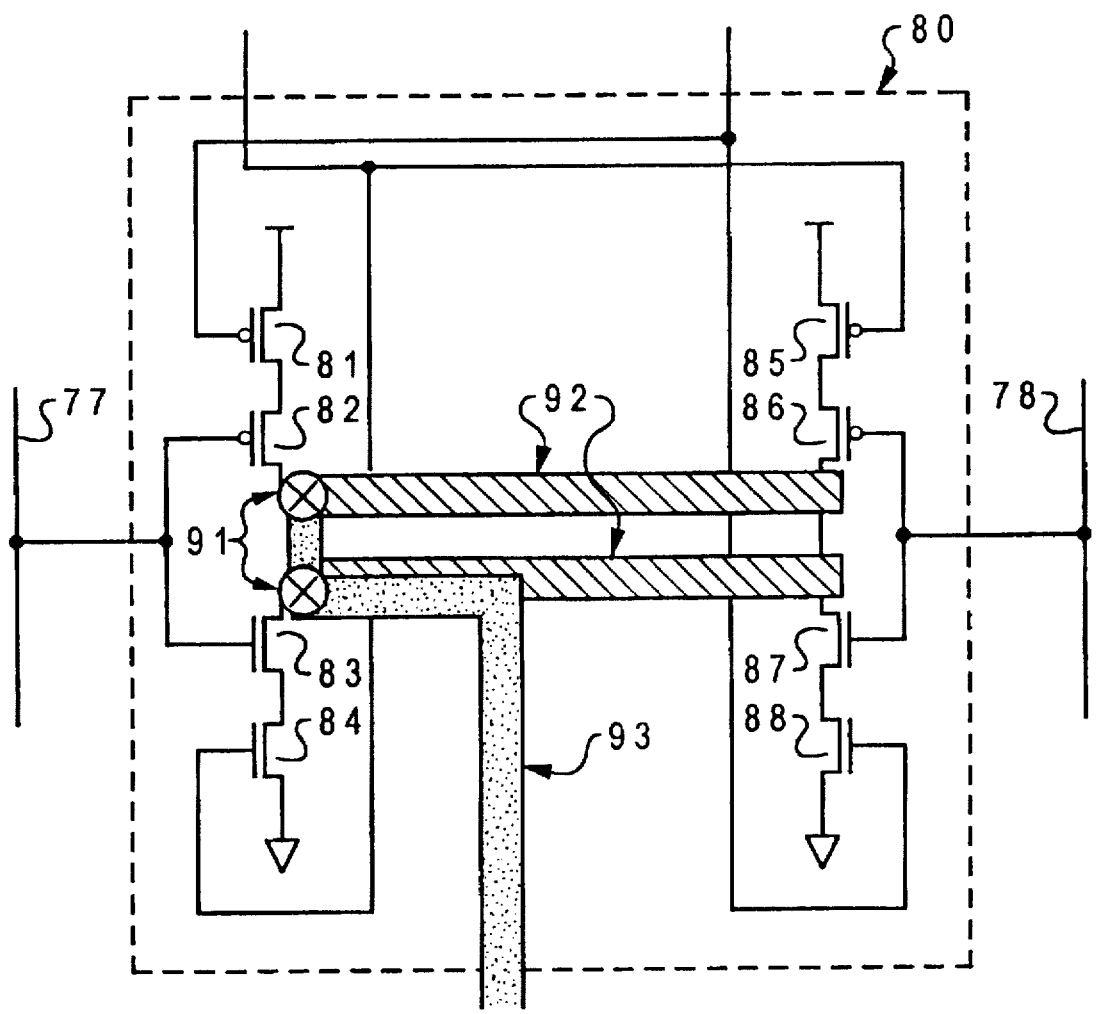
FIG. 5 is a graphical plot of the compare circuitry of FIG. 4 illustrating the number of contacts required for such arrangement.

Referring now to FIG. 5, there is a graphical plot of the compare circuit of FIG. 4 illustrating the contact requirement in accordance with a preferred embodiment of the invention. As shown, poly 93 and diffusion 92 are utilized to illustrate the connection for the invertor output. The invertor is comprised of p-channel transistor 82 and n-channel transistor 83. Only two contacts 91 are required to connect a poly 93 between the source of p-channel transistor 82 and the drain of n-channel transistor 83.

As has been described, the present invention provides an improved compare circuitry for a content-addressable memory within a computer system. With the eight-transistor arrangement for the compare circuitry as depicted in FIG. 4, a compare signal from either compare 77 or compare 78 needs to propagate through only one level of transistors to control match line 73 via n-channel transistor 75. In contrast, with the eight-transistor arrangement under prior art as illustrated in FIG. 3, a compare signal from either 77 or compare 78 would have to propagate through two levels of transistors (transistors 6.5, 66 and transistors 63, 61, for example) to control match line 73 via n-channel transistor 75.

In addition, the performance is improved resulting from the arrangement under the present invention as compare to the arrangement under prior art because there are less source or drain junctions to provide capacitance to the critical path. Using the compare path as an example, there are only five drains of transistors 82, 83, 86, 87 and source of transistor 83 to provide capacitance. In the prior art, capacitance in the critical path was provided by drains of transistors 67, 68, 61, 62, 63, 64 and sources of transistors 62 and 64.

Furthermore, defect reduction and improved layout density may be achieved by the reduced number of contracts utilized in the compare circuit of the present invention over the prior art. The prior art example as depicted in FIG. 3 has at least 6 contacts as opposed to only 2 contacts for the compare circuit under the present invention.

While the invention has been particularly shown and described with reference to a preferred embodiment, it will be understood by those skilled in the art that various changes in form and detail may be made therein without departing from the spirit and scope of the invention.

What is claimed is:

1. A compare circuit for a content-addressable memory, said compare circuit comprising:

a first storage node line and a second storage node line connecting to a memory cell of said content-addressable memory for determining a state of said memory cell, wherein said first storage node line and said second storage node line are complementary to each other;

a first compare line and a second compare line, wherein said first compare line and said second compare line are complementary to each other;

a first set of four transistors connected to said first compare line and connected in series to be enabled by a logical one from said first storage node line for allowing a signal from said first compare line to propagate to an output; and a second set of four transistors connected to said second compare line and connected in series to be enabled by a logical zero from said first storage node line for allowing a signal from said second compare line to propagate to said output such that a signal from either of said first compare line and second compare line needs to propagate through only one level of transistors in order to reach said output.

2. The compare circuit for a content-addressable memory according to claim 1, wherein said first set of four transistors includes two p-channel transistors and two n-channel transistors.

3. The compare circuit for a content-addressable memory according to claim 2, wherein one of said two p-channel transistors is connected to $V_{dd}$ and one of said two n-channel transistors is connected to ground voltage or $V_{ss}$.

4. The compare circuit for a content-addressable memory according to claim 1, wherein said second set of four transistors includes two p-channel transistors and two n-channel transistors.

5. The compare circuit for a content-addressable memory according to claim 4, wherein one of said two p-channel transistors is connected to $V_{dd}$ and one of said two n-channel transistors is connected to ground voltage or $V_{ss}$.

6. A compare circuit for a content-addressable memory, said compare circuit comprising:

a first compare line and a second compare line;

a first inverter connected to said first compare line and connected in series with a first two enabling transistors, wherein said first inverter connected to said first compare line and is enabled by a logical one from a first storage node of said content-addressable memory for allowing a signal from said first compare line to propagate to an output; and a second inverter connected to said second compare line and connected in series with a second two enabling transistors, wherein said second inverter connected to said second compare line and is enabled by a logical zero from said first storage node of said content-addressable memory for allowing a signal from said second compare line to propagate to said output.

7. The compare circuit for a content-addressable memory according to claim 6, wherein said first inverter includes a first p-channel transistor and a first n-channel transistor and said second inverter includes a second p-channel transistor and a second n-channel transistor.

8. The compare circuit for a content-addressable memory according to claim 7, wherein one of said first two enabling transistors is connected between $V_{dd}$ and said first p-channel transistor, wherein one of said second two enabling transistors is connected between $V_{dd}$ and said second p-channel transistor.

9. The compare circuit for a content-addressable memory according to claim 7, wherein a drain of said first n-channel transistors is connected to a source of said first p-channel transistor by a level of polysilicon and two contacts.

10. A content-addressable memory comprising:

a memory cell having a pair of complementary storage node lines;

a compare circuit connecting to said memory cell via said pair of complementary storage node lines, said compare circuit including a pair of complementary compare lines as inputs, wherein said compare circuit includes a first set of four transistors connected in series to be enabled by a logical one from said memory cell and a second set of four transistors connected in series to be enabled by a logical zero from said memory cell; and a match line connecting to an output of said compare circuit, wherein compare signals for said pair of complementary compare lines needs to propagate through only one of said first set or second set of transistors for controlling said match line.

11. The content-addressable memory of claim 10, wherein each of said first set of transistors and second set of transistors includes two p-channel transistors and two n-channel transistors.

* * * * *